United States Patent
King et al.

(10) Patent No.: US 6,590,277 B1
(45) Date of Patent: Jul. 8, 2003

(54) REDUCED STRESS LOC ASSEMBLY

(75) Inventors: Jerrold L. King, Boise, ID (US);
Larry D. Kinsman, Boise, ID (US);
Jerry M. Brooks, Caldwell, ID (US);
David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/505,058

(22) Filed: Feb. 16, 2000

Related U.S. Application Data

(62) Division of application No. 09/416,369, filed on Oct. 12, 1999, now Pat. No. 6,083,777, which is a continuation of application No. 09/041,520, filed on Mar. 12, 1998, now Pat. No. 6,063,650, which is a division of application No. 08/584,738, filed on Jan. 11, 1996, now Pat. No. 5,872,398.

(51) Int. Cl.$^7$ .............................................. H01L 23/495
(52) U.S. Cl. ................. 257/668; 257/669; 257/670; 257/671; 257/674; 257/676
(58) Field of Search ................. 257/668, 669, 257/670, 671, 674, 676

(56) References Cited

U.S. PATENT DOCUMENTS

| | | | |
|---|---|---|---|
| 4,862,245 A | | 8/1989 | Pashby et al. |
| 4,984,059 A | | 1/1991 | Kubota et al. |
| 5,068,712 A | * | 11/1991 | Murakami et al. |
| 5,089,876 A | * | 2/1992 | Ishioka |
| 5,184,208 A | | 2/1993 | Sakuta et al. |
| 5,252,853 A | | 10/1993 | Michii |
| 5,252,854 A | | 10/1993 | Arita et al. |
| 5,286,679 A | | 2/1994 | Farnworth et al. |
| 5,304,842 A | | 4/1994 | Farnworth et al. |
| 5,331,201 A | | 7/1994 | Nishino |
| 5,357,139 A | | 10/1994 | Yaguchi et al. |
| 5,359,224 A | | 10/1994 | Heinen et al. |
| 5,406,124 A | | 4/1995 | Morita et al. |
| 5,442,233 A | | 8/1995 | Anjoh et al. |
| 5,461,255 A | | 10/1995 | Chan et al. |
| 5,466,888 A | | 11/1995 | Beng et al. |
| 5,473,188 A | | 12/1995 | Ando |
| 5,548,160 A | | 8/1996 | Corbett et al. |
| 5,563,443 A | | 10/1996 | Beng et al. |
| 5,572,066 A | * | 11/1996 | Safai et al. |
| 5,585,600 A | | 12/1996 | Froebel et al. |
| 5,608,260 A | | 3/1997 | Carper et al. |
| 5,616,953 A | | 4/1997 | King et al. |
| 5,733,800 A | | 3/1998 | Moden |
| 5,759,875 A | | 6/1998 | Ahmad |
| 5,960,258 A | | 9/1999 | Moden |

OTHER PUBLICATIONS

Kovac, Caroline A., et al., *Plastic Package Fabrication*, Electronic Materials Handbook, pp. 470–482, 1989.

Manzione, Louis T., *Plastic Packaging of Microelectronic Devices*, pp. 156–161, 168–173, 186–189, 194–199, 212–215, 224–229, 302–303 & 346–347, AT&T Bell Laboratories Division, 1990.

* cited by examiner

Primary Examiner—David E. Graybill
(74) Attorney, Agent, or Firm—TraskBritt

(57) ABSTRACT

An LOC die assembly including a die dielectrically adhered to the under of lead frame. The adhesive is applied over a minimum cross-sectional area and number of attachment points to maximize flexure of leads extending over the active surface of the die. In this manner, flexure of the leads to accommodate filler particles lodged between the leads and the active surface of the die during transfer molding of a plastic encapsulant is maximized, and the point stresses on the active surface caused by the filler particles are reduced by the lead flexure.

14 Claims, 6 Drawing Sheets

REDUCED STRESS LOC ASSEMBLY

CROSS-REFERENCE TO RELATED APPLICATIONS:

This application is a divisional of application Ser. No. 09/416,369, filed Oct. 12, 1999, now U.S. Pat. No. 6,083,777, issued Jul. 4, 2000, which is a continuation of application Ser. No. 09/041,520, filed Mar. 12, 1998, now U.S. Pat. No. 6,063,650, issued May 16, 2000, which is a divisional of application Ser. No. 08/584,738, filed Jan. 11, 1996, now U.S. Pat. No. 5,872,398, issued Feb. 16, 1999.

BACKGROUND OF THE INVENTION

1. Field of the Invention

The invention pertains to a "leads over chip" (LOC) semiconductor die assembly and, more particularly, to a method and apparatus for reducing the stress resulting from lodging of filler particles present in plastic encapsulants between the undersides of the lead frame leads and the active surface of the die.

2. State of the Art

The use of LOC semiconductor die assemblies has become relatively common in the industry in recent years. This style or configuration of semiconductor device replaces a "traditional" lead frame with a central, integral support (commonly called a die-attach tab, paddle, or island) to which the back surface of a semiconductor die is secured, with a lead frame arrangement wherein the dedicated die-attach support is eliminated and at least some of the leads extend over the active surface of the die. The die is then adhered to the lead extensions with an adhesive dielectric layer of some sort disposed between the undersides of the lead extensions and the die. Early examples of LOC assemblies are illustrated in U.S. Pat. No. 4,862,245 to Pashby et al. and U.S. Pat. No. 4,984,059 to Kubota et al. More recent examples of the implementation of LOC technology are disclosed in U.S. Pat. Nos. 5,184,208; 5,252,853; 5,286,679; 5,304,842; and 5,461,255. In instances known to the inventors, LOC assemblies employ large quantities or horizontal cross-sectional areas of adhesive to enhance physical support of the die for handling.

Traditional lead frame die assemblies using a die-attach tab place the inner ends of the lead frame leads in close lateral proximity to the periphery of the active die surface where the bond pads are located, wire bonds then being formed between the lead ends and the bond pads. LOC die assemblies, by their extension of inner lead ends over the die, permit physical support of the die from the leads themselves as well as more diverse (including centralized) placement of the bond pads on the active surface, as well as the use of the leads for heat transfer from the die. However, use of LOC die assemblies in combination with plastic packaging of the LOC die assembly, as known in the art, has demonstrated some shortcomings of LOC technology as presently practiced in the art.

By far the most common manner of forming a plastic package about a die assembly is molding, and specifically transfer molding. In this process (and with specific reference to LOC die assemblies), a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in a thermosetting polymer which, when heated, reacts irreversibly to form a highly cross-linked matrix no longer capable of being re-melted.

The thermosetting polymer generally is comprised of three major components: an epoxy resin, a hardener (including accelerators), and a filler material. Other additives such as flame retardants, mold release agents and colorants are also employed in relatively small amounts. While many variations of the three major components are known in the art, the focus of the present invention resides in the filler materials employed and their effects on the active die surface.

Filler materials are usually a form of fused silica, although other materials such as calcium carbonates, calcium silicates, talc, mica and clays have been employed for less rigorous applications. Powdered fused quartz is currently the primary filler used in encapsulants. Fillers provide a number of advantages in comparison to unfilled encapsulants. For example, fillers reinforce the polymer and thus provide additional package strength, enhance the thermal conductivity of the package, provide enhanced resistance to thermal shock, and greatly reduce the cost of the polymer in comparison to its unfilled state. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package, as well as the moisture permeability of the package.

One previously unrecognized disadvantage discovered by the inventors herein is damage to the active die surface resulting from encapsulant filler particles becoming lodged or wedged between the underside of the lead extensions and the active die surface during transfer molding of the plastic package about the die and the inner lead ends of the LOC die assembly. The filler particles, which may literally be jammed in position due to deleterious polymer flow patterns and flow imbalances in the mold cavity during encapsulation, place the active die surface under residual stress at the points of contact of the particles. The particles may then damage the die surface or conductive elements thereon or immediately thereunder when the package is further stressed (mechanically, thermally, electrically) during post-encapsulation handling and testing.

While it is possible to employ a lower volume of filler in the encapsulating polymer to reduce potential for filler particle lodging or wedging, a drastic reduction in filler volume raises costs of the polymer to unacceptable levels. Currently available filler technology also imposes certain limitations as to practical, beneficial reductions in particle size (currently in the 75 to 125 micron range, with the larger end of the range being easier to achieve with consistency) and in the shape of the filler particles. While it is desirable that particles be of generally spherical shape, it has thus far proven impossible to eliminate non-spherical flakes or chips which, in the wrong orientation, maximize stress on the die surface.

Ongoing advances in design and manufacturing technology provide increasingly thinner conductive, semiconductive and dielectric layers in state-of-the-art dies, and the width and pitch of conductors serving various purposes on the active surface of the die are likewise being continually reduced. The resulting die structures, while robust and reliable for their intended uses, must nonetheless become more stress-susceptible due to the minimal strength provided by the minute widths, depths and spacings of their constituent elements. The integrity of active surface die coats such as silicon dioxide, doped silicon dioxides such as phosphorous silicate glass (PSG) or borophosphorous silicate glass (BPSG), or silicon nitride, may thus be compromised by point stresses applied by filler particles, the result being unanticipated shortening of device life if not immediate, detectable damage or alteration of performance characteristics.

The aforementioned U.S. Pat. No. 4,984,059 to Kubota et al. does incidentally disclose several exemplary LOC arrangements which appear to greatly space the leads over the chip or which do not appear to provide significant areas for filler particle lodging. However, such structures may create fabrication and lead spacing and positioning difficulties.

To the inventors' knowledge, those of ordinary skill in the art have failed to recognize this particular stress phenomenon attendant to transfer molding and the use of filled encapsulants. The current state of the art provided an LOC structure which beneficially accommodates this phenomenon.

SUMMARY OF THE INVENTION

The present invention provides the lead-supported die assembly of a conventional LOC arrangement, but substantially reduces the direct adhesion of the dies to elements of the lead frame to promote more flexibility in bending and torsion in the leads-to-die attachment mechanism to beneficially accommodate the presence of filler particles of the polymer encapsulant between the leads and the active die surface. The minimization of the pre-encapsulation direct leads-to-die adhesion permits lead flexure in response to the introduction of an underlying filler particle or particles during the transfer molding process, and thus an immediate reduction in the residual stress experienced by the active die surface responsive to the filler introduction. This lessened residual stress is carried forward in the encapsulated package after cure, permitting the package to better withstand the stresses of post-encapsulation handling and testing, including the elevated potentials and temperatures experienced during burn-in, without adverse effects.

The LOC apparatus of the present invention comprises a die and a lead frame, to which the active surface of the die is directly adhered over a minimum cross-sectional area of lead frame surface with a dielectric adhesive to permit the lead frame to physically support the die during pre-encapsulation handling and processing such as wire bonding, while providing an enhanced degree of lead flexure during the encapsulation process. With such an arrangement, intrusion of filler particles between the inner lead ends and the active surface of the die during the encapsulation process is beneficially accommodated.

Stated in more specific terms and on the scale of an individual lead and the underlying active surface of the die, the dielectric adhesive (tape, screen print or spin-on, as known in the art) disposed on the underside of a lead is minimized in both cross-sectional area and longitudinal extent along the lead axis. This design permits the free end of the lead interior of the adhesion point of the lead to the die to flex in bending and torsion, so as to bend or twist in the presence of a filler particle lodged between that lead and the die.

Characterized in yet another manner, the invention contemplates the application of a dielectric adhesive onto the lead frame in a pattern calculated to minimize the required cross-sectional area of adhesive while providing adequate physical support for the die by the lead frame.

Characterized in yet another manner, the invention contemplates the application of a dielectric adhesive to certain lead frame elements, such as buses, in a substantially continuous manner so as to adequately support the die and prevent filler particle intrusion between those elements and the die, while permitting other lead frame elements, such as inner lead ends, to substantially completely free-float and flex with respect to the die surface before and during the encapsulation process.

It is also contemplated that certain lead frame elements, such as particular leads, may be configured with enlarged inner lead ends to receive the dielectric adhesive to provide required physical support for the die, while other lead frame elements are permitted to free-float and flex during the encapsulation process.

DETAILED DESCRIPTION OF THE INVENTION

So that the reader may more fully understand the present invention in the context of the prior art, it seems appropriate to provide a brief description of a transfer apparatus and method for forming a plastic package about an LOC die assembly. The term "transfer" molding is descriptive of this process as the molding compound, once melted, is transferred under pressure to a plurality of remotely located mold cavities containing die assemblies to be encapsulated.

Figure 1:
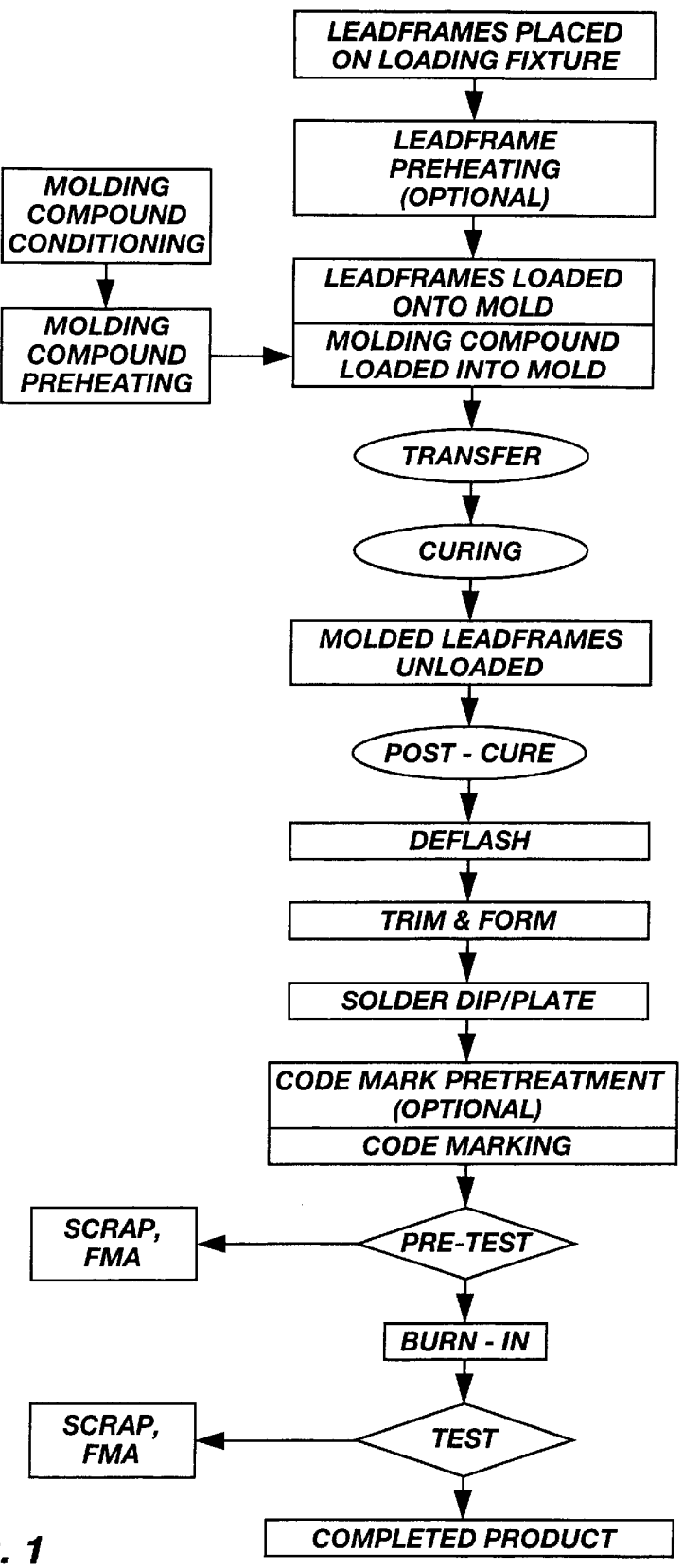
FIG. 1 comprises a flow chart of an exemplary process sequence for plastic package molding.

FIG. 1 is a flow chart of a typical process sequence for plastic package molding. It should be noted that the solder dip/plate operation has been shown as one step for brevity; normally, plating would occur prior to trim and form.

Figure 2A:
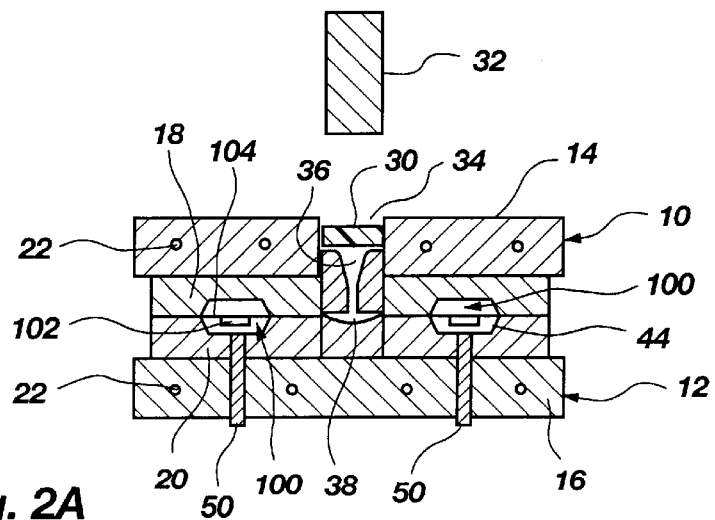
FIGS. 2A and 2B are side schematic views of a typical transfer molding, showing pre-molding and post-molding encapsulant positions.
Figure 2B:
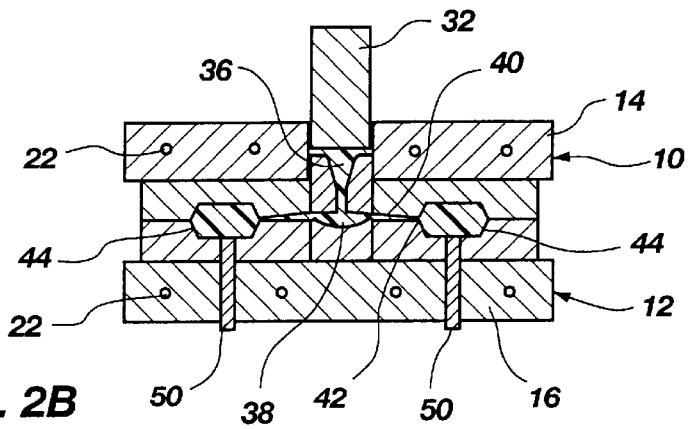
Figure 3:
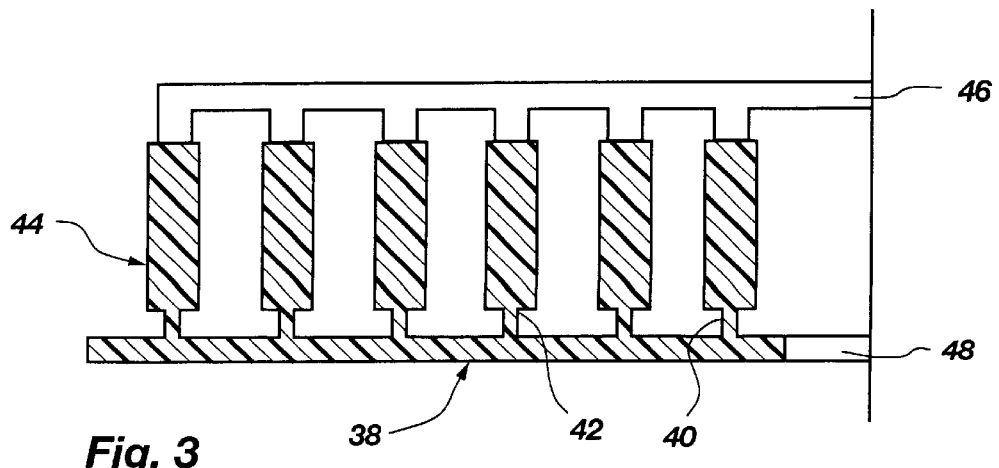
FIG. 3 shows a top schematic view of one side of a transfer mold of FIGS. 2A and 2B, depicting encapsulant flow and venting of the primary mold runner and the mold cavities wherein the die assemblies are contained.

FIGS. 2A and 2B show pre-molding and post-molding positions of encapsulant during a transfer molding operation using a typical mold apparatus comprising upper and lower mold halves 10 and 12, each mold half including a platen 14 or 16 with its associated chase 18 or 20. Heating elements 22 are employed in the platens to maintain an elevated and relatively uniform temperature in the runners and mold cavities during the molding operation. FIG. 3 shows a top view of one side of the transfer mold apparatus of FIGS. 2A and 2B.

In operation, a heated pellet of resin mold compound 30 is disposed beneath ram or plunger 32 in pot 34. The plunger descends, melting the pellet and forcing the melted encapsulant down through sprue 36 and into primary runner 38, from which it travels to transversely oriented secondary runners 40 and across gates 42 into and through the mold cavities 44, wherein die assemblies 100 comprising dies 102 with attached lead frames 104 are disposed (usually in strips so that a strip of six lead frames, for example, would be cut and placed in and across the six cavities 44 shown in FIG. 3). Air in the runners 38 and 40 and mold cavities 44 is vented to the atmosphere through vents 46 and 48. At the end of the molding operation, the encapsulant is "packed" by application of a higher pressure to eliminate voids and reduce nonuniformities of the encapsulant in the mold cavities 44. After molding, the encapsulated die assemblies are ejected from the cavities 44 by ejector pins 50, after which they are post-cured at an elevated temperature to complete cross-linking of the resin, followed by other operations as known in the art and set forth in FIG. 1 by way of example. It will be appreciated that other transfer molding apparatus configurations, as well as variations in the details of the described method, are known in the art. However, none of such are pertinent to the invention, and so will not be discussed herein.

Figure 4A:
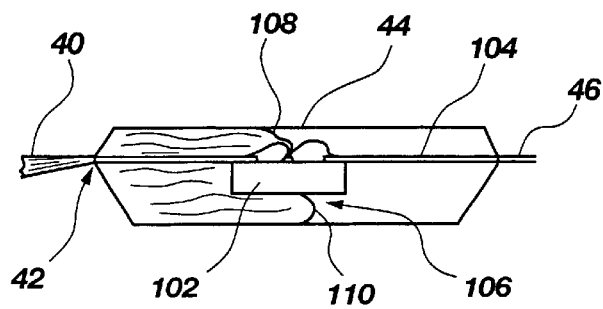
FIGS. 4A, 4B and 4C depict encapsulant flow scenarios for a mold cavity.
Figure 4B:
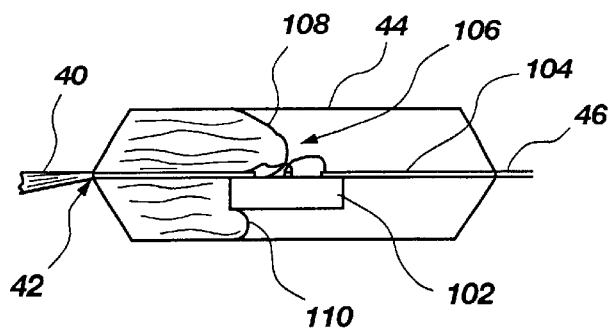
Figure 4C:
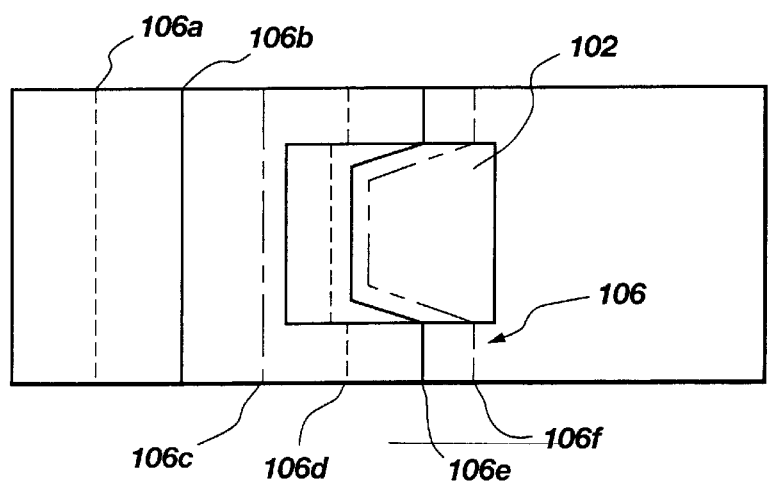

Encapsulant flow in the mold cavities 44 is demonstrably non-uniform. The presence of the die assembly 100 comprising a die 102 with lead frame 104 disposed across the mid-section of a cavity 44 splits the viscous encapsulant flow front 106 into upper 108 and lower 110 components. Further, the presence of the (relatively) large die 102 with its relatively lower temperature in the middle of a cavity 44 permits the flow front 106 on each side of the die 102 to advance ahead of the flow front which passes over and under the die 102. FIGS. 4A and 4B show two mold cavity encapsulant flow scenarios where, respectively, the lower flow front 110 and the upper flow front 108 lead the overall encapsulant flow front 106 in the cavity 44 containing the die assembly 100. FIG. 4C depicts the advance of a flow front 106 from above, before and after a die 102 is encountered, the flow being depicted as time-separated instantaneous flow fronts 106a, 106b, 106c, 106d, 106e and 106f.

Encapsulant filler particles, as noted above, become lodged between lead ends and the underlying die surfaces. The non-uniform flow characteristics of the viscous encapsulant flow, as described above, may cause (in addition to other phenomena, such as wire sweep, which are not relevant to the invention) particles to be more forcefully driven between the leads and the die and wedged or jammed in place in low-clearance areas. As the encapsulant flow front advances and the mold operation is completed by packing the cavities, pressure in substantially all portions of the cavities reaches hydrostatic. With prior art lead and adhesive LOC arrangements, the relative inflexibility of the tightly constrained (adhered) lead ends maintains the point stresses of the particles trapped under the leads. These residual stresses are carried forward in the fabrication process to post-cure and beyond. When mechanical, thermal or electrical stresses attendant to post-encapsulation processing are added to the residual point stresses associated with the lodged filler particles, cracking or perforation of the die coat may occur, with the adverse effects previously noted. It has been observed that filler particle-induced damage occurs more frequently in close proximity to the adhesive, where lead flexure potential is at its minimum.

Figure 5A:
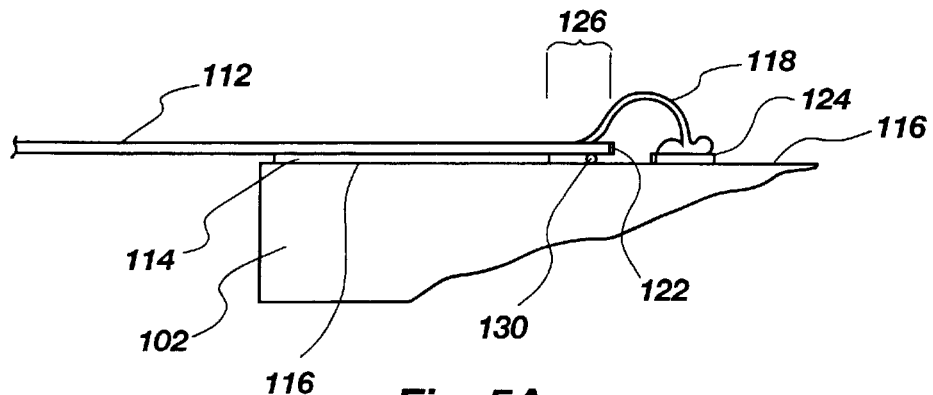
FIGS. 5A, 5B and 5C respectively depict schematic side views of a prior art lead, adhesive and die surface arrangement and two arrangements according to the present invention.

To graphically illustrate the above description of particle lodging, FIG. 5A depicts a prior art LOC assembly wherein a single lead 112 extends over a die 102, with a segment of dielectric adhesive 114, in this instance a piece of Kapton™ polyimide tape, adhered to both the lead 112 and the active surface 116 of the die. A bond wire 118 is shown extending from lead end 122 to bond pad 124 on die 102 for purposes of proper perspective. Filler particle 130 is lodged between lead end 122 and die surface 116. It is clear that lead 112 is tightly constrained by its relatively short free or cantilevered extent 126 from flexing or relaxing to reduce stress occasioned by the presence of the filler particle 130, even after the encapsulant has reached hydrostatic balance.

Figure 5B:
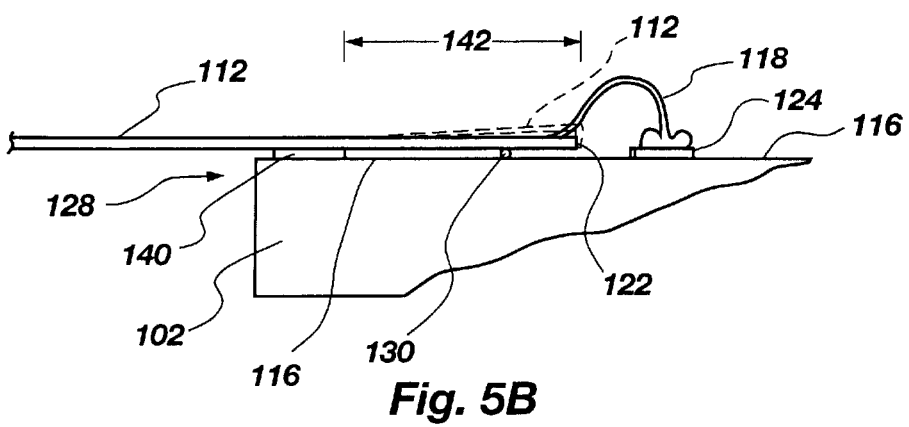

FIG. 5B depicts, in contrast to the prior art, an LOC arrangement according to the present invention, wherein a single lead 112 also extends over die 102. Instead of the tight lead-to-die constraint provided by the prior art adhesive segment, an abbreviated adhesive segment 140 is employed proximate the periphery 128 of die 102. The inwardly extending (from the die periphery toward the interior) lead 112 is free or cantilevered throughout a large longitudinal extent 142 between adhesive 140 and its free end 122, permitting increased flexure in both bending and twisting or torsion, as shown in broken lines. Thus, a filler particle 130, while still lodged in place, does not cause the same amount of residual stress to the die surface 116, due to the ability of the lead 112 to, in effect, relax and reach a steady state position under hydrostatic encapsulant pressure, which relaxation reduces the point stress of the particle contact with the die surface to an acceptable level.

Figure 5C:
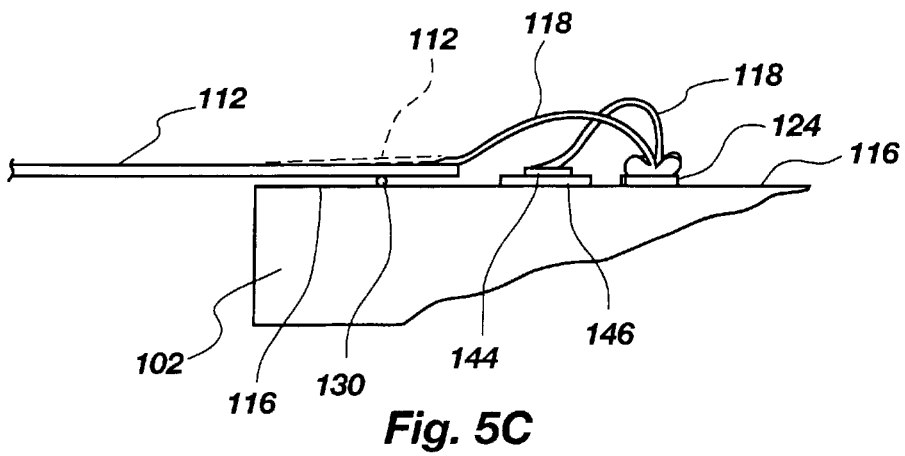

FIG. 5C depicts an alternative arrangement according to the present invention, wherein a first lead 112 is disposed over, but is not adhered to, the underlying die surface 116. An adjacent lead end, or even a bus, designated 144, extends over die surface 116 and is adhered to it by a segment of adhesive 146 located under the entire "footprint" of the lead end or bus over the die. If desired, certain lead ends may be enlarged to provide additional area for adhesion. A bus may, and in current design practice normally does, extend across a die from one side or end to the other side or end, and so provides an ideal surface under which a dielectric adhesive such as a tape may be located. As seen in FIG. 5C, a filler particle 130 is lodged under lead 112. In this instance, the entire length of the lead 112 is free-floating and cantilevered from the outer peripheral portion of the lead frame 104 (not shown) beyond the boundaries of die 102. Thus, a great degree of bending and torsional flexure (shown in broken line) is afforded to reduce the magnitude of point-loading of the filler particle 130 against die surface 116.

Figure 6:
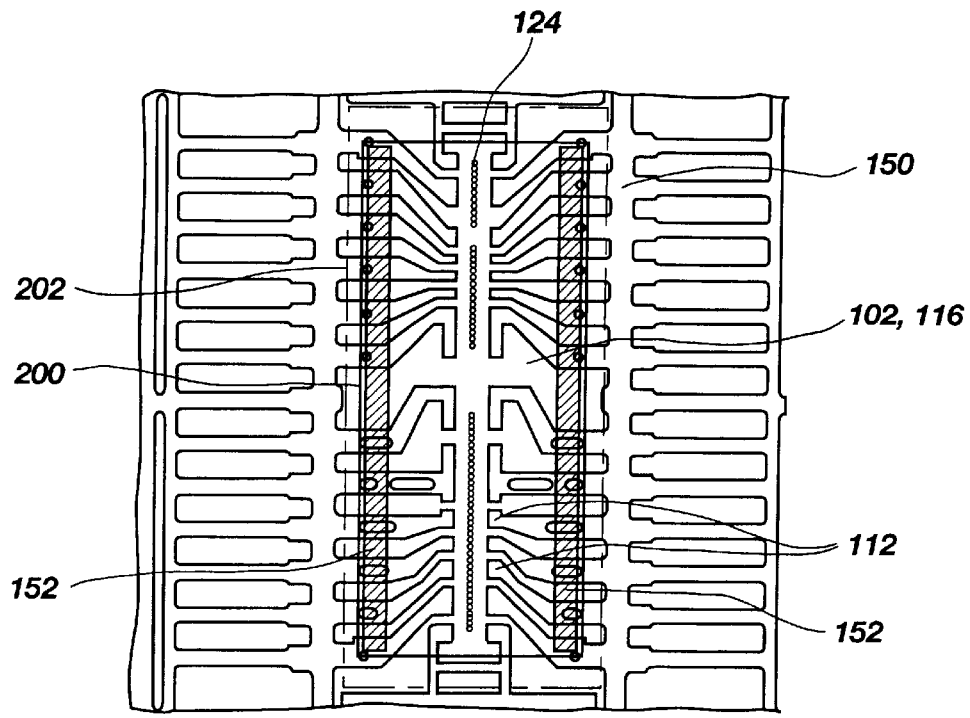
FIGS. 6, 7, 8 and 9 respectively depict top views of a variety of lead frame configurations and dielectric adhesive arrangements according to the present invention.

FIGS. 6 though 9 depict a variety of lead frame, adhesive and die arrangements in accordance with the present invention. For purposes of clarity and perspective, the inner, solid line 200 on each Figure is the periphery of the die onto which the lead frame is superimposed and to which the lead frame is adhesively secured. The outer lateral border of the plastic package to be molded on each lead frame is shown as an outer, dotted and dashed line 202 on each Figure. Further, the adhesive segments disposed between certain leads or-buses and the die, as described below, are cross-hatched for purposes of clarity. For purposes of illustration, the semiconductor die as illustrated comprises memory devices, such as dynamic random access memory (DRAM), or static random access memory (SRAM), although the invention has equal utility to any semiconductor device wherein an LOC arrangement is employed.

FIG. 6 depicts an arrangement wherein a lead frame 150, superimposed on a die 102, is secured thereto with dielectric adhesive strips or elongated segments 152 running along each side of active die surface 116. Leads 112 thus extend inwardly in a flexible, cantilevered manner from adhesive segments 152 toward a row of bond pads 124 running along the center of the die 102. Filler particles 130 (FIG. 5B) lodged under a lead 112 may thus cause that lead to freely bend or twist, as required, to relieve stress.

Figure 7:
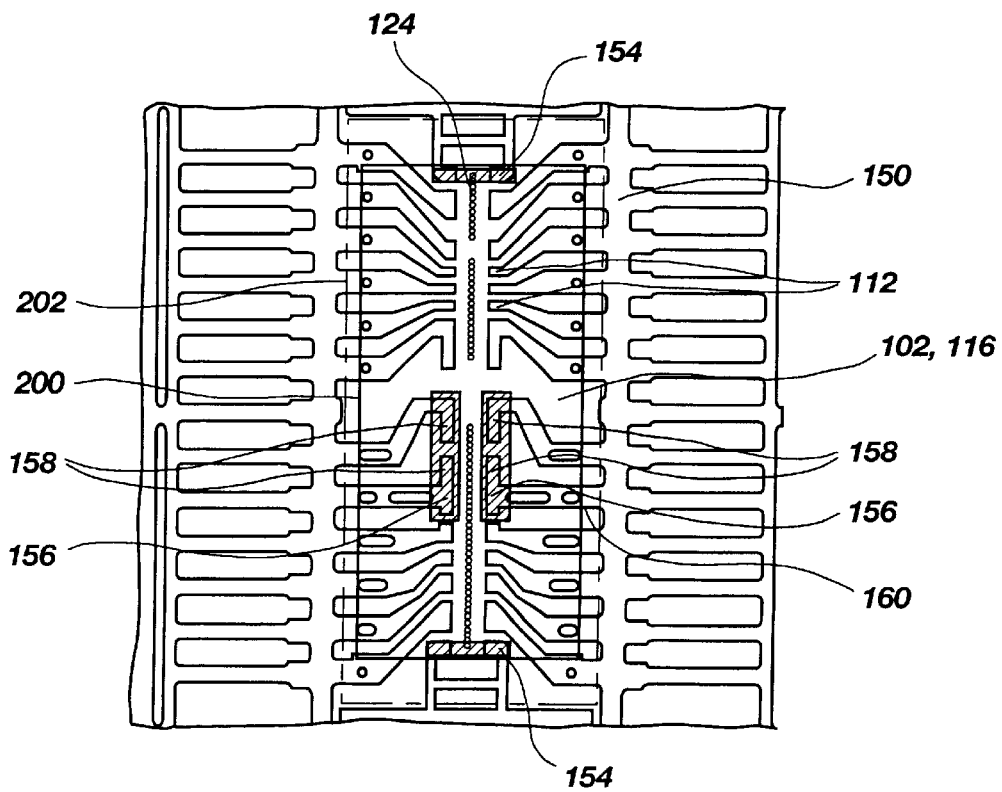

FIG. 7 depicts an arrangement wherein lead frame 150 is secured to underlying die 102 using four abbreviated adhesive segments, two end segments 154 and two mid-segments 156. The unadhered leads 112 are again permitted to free-float and flex above the die surface 116, not being secured thereto at any point (except by bond wires, not shown). It should also be noted that mid-segments 156 are adhered to enlarged lead ends 158 on several leads, the segments 156 extending substantially under the entire enlarged lead end. The leads associated with these enlarged ends 158 are permitted to flex between ends 158 and their outer ends 160 which merge into lead frame 150. In both instances, the leads involved may flex and accommodate the presence of filler particles 130 (see FIGS. 5B and 5C).

Figure 8:
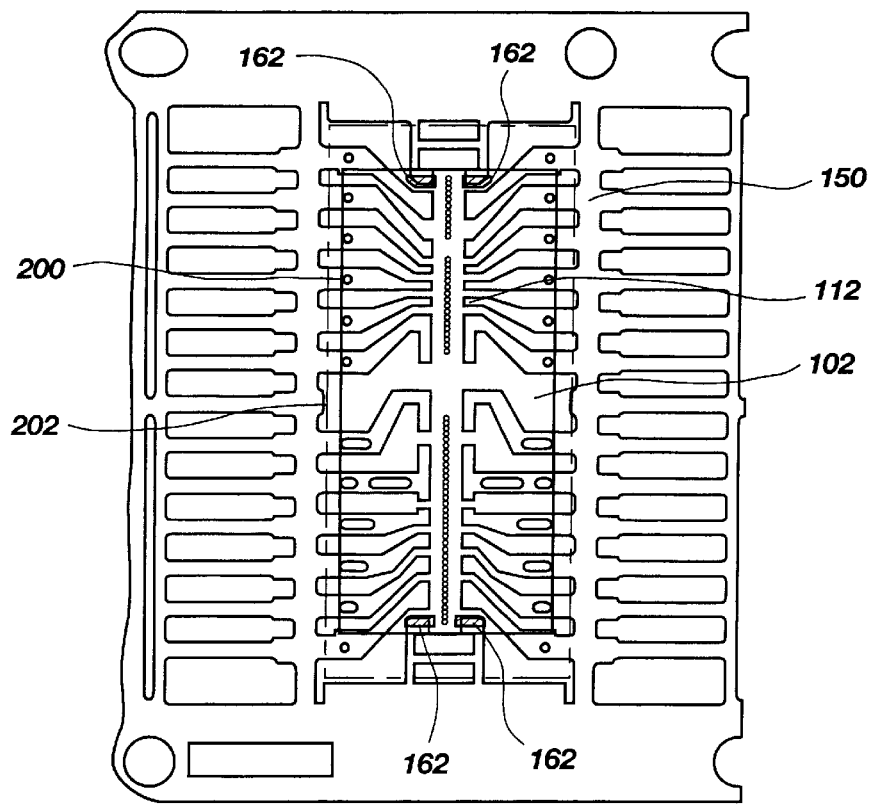

FIG. 8 depicts an arrangement wherein lead frame 150 is secured to underlying die 102 only at four small points defined by dielectric adhesive segments 162, the remainder of the leads 112 being flexurally free across the die surface 116 to accommodate the presence of filler particles 130 (see FIGS. 5B and 5C) and relieve stress.

Figure 9:
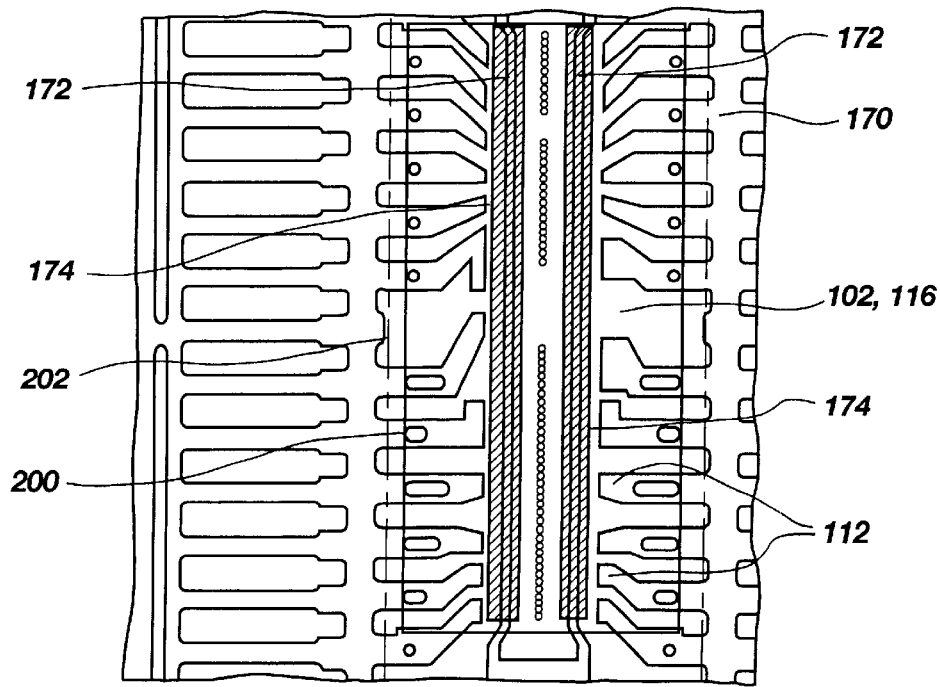

FIG. 9 depicts an arrangement wherein a lead frame 170 of alternative design including a plurality of buses 172 is secured to underlying die 102 by two strips of dielectric adhesive 174 extending across die surface 116 substantially coextensively with buses 172. Thus, filler particles 130 cannot be trapped under buses 172, while the other leads 112 are free to flex and beneficially accommodate the presence of filler particles 130 (see FIGS. 5B and 5C).

It will be appreciated by those of ordinary skill in the art that several different adhesive attachment arrangements may be employed, as illustrated, with a single lead frame and die design to minimize the direct attachment of the die and the leads. Moreover, given the known mechanical characteristics of a lead frame of a given material and thickness, as well as the lead configurations, the optimum support points or regions for location of the dielectric adhesive may be easily calculated, if required. Further, given the known adhesive characteristics and physical strength of a given dielectric adhesive (whether screen-print or spin-on), again the minimum cross-sectional area of adhesive for die support may be calculated. If a dielectric tape is employed, the lead-side and die-side adhesive characteristics (usually different adhesives) are each known data, as is the physical strength of the tape, so that the minimum acceptable tape may be ascertained. With that explanation, no further design details are believed to be necessary for practice of the invention by those of ordinary skill in the art. CAD (computer aided design) may easily, and preferentially, be employed to make the foregoing determinations and arrive at one or more optimum solutions for adhesive locations and magnitude of lead-to-die adhered area for a given die size, weight and shape, and lead frame material, thickness and configuration.

The invention is also contemplated as encompassing structures wherein a dielectric is disposed and adhered only at select locations between the die active surface and the lead frame, as well as structures wherein a dielectric may be located over substantially the entire active surface of the die, but only adhered at select locations to provide die support by the lead frame. The choice of configurations may depend on the need for an alpha barrier over substantially the entire active surface of the die, which in turn is largely dependent upon the availability and cost-effectiveness of low-alpha molding compounds. It is further contemplated that relatively complex dielectric patterns or templates may be developed to provide alpha barrier coverage of a significant portion of the active surface of the die which is not overlaid with leads (e.g., an inter-lead barrier). However, this is a less preferred alternative due to precision alignment requirements for the dielectric in such a case.

While the invention has thus far been described in terms of reducing the incidence of die coat damage due to filler particles, it should also be recognized that the use of only abbreviated adhesive attachment between the leads and the die enhances the uniformity of the flow front of encapsulant, and reduces the tendency toward formation of voids by promoting flow of the encapsulant over, under and around the leads and over the die surface. It is believed that improved PRT (Preconditioned Reflow Test, also termed a "popcorn" test by virtue of its deleterious effect on substandard package integrity) performance, indicative of reduced levels of moisture in the cured encapsulant, will be realized by a reduction in the amount of dielectric tape employed in the package. However, this has yet to be empirically demonstrated.

The present invention has been disclosed in terms of certain preferred embodiments as illustrated and described herein. However, those of ordinary skill in the art will recognize and appreciate that it is not so limited, and that many additions, deletions and modifications to, and combinations of, the disclosed embodiments may be effected without departing from the scope of the invention as hereinafter claimed. For example, the type and manner of application of the dielectric adhesive may include any known in, or contemplated by, the art. Multi-layer LOC lead frames such as a two-frame LOC assembly (see above-referenced U.S. Pat. No. 5,461,255) may be adapted to the present invention. Further, the invention is not limited to a particular arrangement of leads, or to a particular lead cross-section or configuration.

It will also be appreciated by those of ordinary skill in the art that the method and apparatus disclosed herein relate to a structure which is an intermediate product in the fabrication of a plastic-packaged semiconductor device, specifically with regard to the non-adherence of lead elements of a lead frame to the active surface of the die over which the lead elements extend. In that regard, and as noted above, the encapsulant which is molded about both lead frame and die may "adhere" the leads to the die when cured and cross-linked. However, this post-molding adherence is of no import to the invention, which relates to reduction of filler particle-induced stresses during and after a transfer molding operation by permitting lead element flexure during such an operation, and to enhancing the integrity of a molded plastic package by minimizing the direct adhesion between the lead frame and the die.

What is claimed is:

1. A semiconductor die assembly, comprising:
   a semiconductor die having an active surface bounded by a peripheral edge;
   a lead frame including a plurality of lead elements extending from beyond the peripheral edge inwardly over the active surface of the die; and at least one adhesive segment disposed between and affixing a portion of at least one of the plurality of inwardly extending lead elements to the active surface adjacent the peripheral edge such that the at least one inwardly extending lead element is cantilevered inwardly of the at least one adhesive segment over the active surface of the die for at least a majority of its length above the active surface.

2. The semiconductor die assembly of claim 1, wherein at least another of the plurality of inwardly extending lead elements is completely unsupported for its respective length over the active surface.

3. The semiconductor die assembly of claim 2, wherein the at least another inwardly extending lead element is permitted to flex above the active surface.

4. The semiconductor die assembly of claim 1, wherein a majority of the plurality of inwardly extending lead elements are unsupported for a majority of their respective lengths over the active surface.

5. The semiconductor die assembly of claim 1, wherein the at least one adhesive segment is of a size and shape corresponding to the portion of the lead frame to which it is adhered.

6. The semiconductor die assembly of claim 1, wherein the at least one adhesive segment comprises a plurality of adhesive segments sized and configured to provide the least direct adherence between the lead frame and the die required to support the die from the lead frame.

7. A semiconductor die assembly, comprising:

a semiconductor die having an active surface bounded by a peripheral edge;

a lead frame comprising a plurality of lead elements extending from beyond the peripheral edge inwardly over the active surface of the die, at least one of the plurality of inwardly extending lead elements being adhered to a portion of the semiconductor die at a location adjacent the peripheral edge such that the at least one lead element is permitted to flex inwardly of the location of adherence for a majority of its length above the active surface.

8. The semiconductor die assembly of claim 7, wherein at least another of the plurality of inwardly extending lead elements is completely unsupported for its respective length over the active surface.

9. The semiconductor die assembly of claim 7, further comprising at least one adhesive segment adhering the at least one inwardly extending lead element to the portion of the semiconductor die, wherein the at least one adhesive segment is of a size and shape corresponding to the portion of the lead frame to which it is adhered.

10. The semiconductor die assembly of claim 7, further comprising a plurality of adhesive segments, at least one of the plurality of adhesive segments adhering the at least one inwardly extending lead element to the portion of the semiconductor die, wherein the plurality of adhesive segments are sized and configured to provide the least direct adherence between the lead frame and the die required to support the die from the lead frame.

11. A packaged semiconductor die assembly comprising:

a semiconductor die having an active surface bounded by a peripheral edge;

at least one lead element extending from beyond the peripheral edge inwardly over the active surface;

an adhesive segment adhered between the die and the at least one lead element at a location adjacent the peripheral edge such that the adhesive segment is adhered to the at least one lead element for a minority of its length over the active surface; and transfer molding encapsulating a majority of the length of the at least one lead element over the active surface.

12. The semiconductor die assembly of claim 11, wherein at least one of the at least one lead element has no adhesive segment contacting it along its respective length over the active surface.

13. The semiconductor die assembly of claim 11, wherein the at least one adhesive segment is of a size and shape corresponding to a portion of the lead frame to which it is adhered.

14. The semiconductor die assembly of claim 11, wherein the at least one adhesive segment includes a plurality of adhesive segments adhering the lead frame to the die, wherein the plurality of adhesive segments are sized and configured to provide the least direct adherence between the lead frame and the, die required to support the die from the lead frame.

* * * * *